US011402725B2

(12) United States Patent
Schulten et al.

(10) Patent No.: US 11,402,725 B2
(45) Date of Patent: Aug. 2, 2022

(54) ASSEMBLY FOR LIGHTING AND RECORDING A SCENE

(71) Applicant: OSRAM Opto Semiconductors GmbH, Regensburg (DE)

(72) Inventors: Dominik Schulten, Regensburg (DE); Michael Schumann, Neu-Ulm (DE); Dominik Scholz, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 232 days.

(21) Appl. No.: 16/488,105

(22) PCT Filed: Feb. 22, 2018

(86) PCT No.: PCT/EP2018/054403
§ 371 (c)(1),
(2) Date: Aug. 22, 2019

(87) PCT Pub. No.: WO2018/153996
PCT Pub. Date: Aug. 30, 2018

(65) Prior Publication Data
US 2019/0384140 A1    Dec. 19, 2019

(30) Foreign Application Priority Data
Feb. 24, 2017   (DE) .......................... 102017103883.3

(51) Int. Cl.
*G03B 15/05*    (2021.01)
*H04N 5/225*    (2006.01)
(Continued)

(52) U.S. Cl.
CPC ........... *G03B 15/05* (2013.01); *H04N 5/2256* (2013.01); *H04N 5/2354* (2013.01); *G03B 7/17* (2015.01);
(Continued)

(58) Field of Classification Search
CPC .. G03B 15/05; G03B 7/17; G03B 2215/0564; G03B 15/02; G03B 2215/0503;
(Continued)

(56) References Cited

U.S. PATENT DOCUMENTS 6,329,758 B1   12/2001  Salam
8,483,557 B1    7/2013  Yost et al.
(Continued)

FOREIGN PATENT DOCUMENTS

DE   102009047788 A1   3/2011
DE   202015101842 U1   7/2016
(Continued)

*Primary Examiner* — Lin Ye
*Assistant Examiner* — Tuan H Le
(74) *Attorney, Agent, or Firm* — Slater Matsil, LLP

(57) ABSTRACT

An assembly is disclosed. In an embodiment an assembly includes a light source configured to illuminate a field of view, a control circuit configured to operate the light source and a camera configured to record a scene in the field of view, wherein the light source comprises at least one semiconductor component having at least one semiconductor chip, wherein the semiconductor chip has an semiconductor layer sequence with an active region, wherein the semiconductor chip comprises the plurality of pixels, wherein the plurality of pixels are configured to generate radiation of the light source, wherein the control circuit has a memory configured to store operational data of the light source, wherein the control circuit is configured to operate the pixels on basis of the operational data, and wherein the arrangement is configured to perform an adaptation of at least a part of the operational data in the memory during operation of the arrangement.

15 Claims, 9 Drawing Sheets

(51) Int. Cl.
  *H04N 5/235* (2006.01)
  *G03B 7/17* (2021.01)

(52) U.S. Cl.
  CPC .... *G03B 2215/0564* (2013.01); *H04N 5/2351* (2013.01)

(58) Field of Classification Search
  CPC ...... G03B 7/16; H04N 5/2256; H04N 5/2354; H04N 5/2351; H04N 5/23218; H04N 2101/00; H04N 5/23212; H04N 5/23245; H04N 5/23219; H04N 9/735; H01L 25/0753; H01L 25/167; G06T 7/20; G06T 2207/30201
  See application file for complete search history.

(56) References Cited

U.S. PATENT DOCUMENTS

| | | | |
|---|---|---|---|
| 8,577,218 B2 | 11/2013 | von Malm et al. | |
| 9,192,021 B2 | 11/2015 | Hafner et al. | |
| 9,362,335 B2 | 6/2016 | von Malm | |
| 10,103,195 B2 | 10/2018 | Damilano et al. | |
| 10,251,237 B2 | 4/2019 | Spiess et al. | |
| 2004/0105264 A1 | 6/2004 | Spero | |
| 2005/0046739 A1 | 3/2005 | Voss et al. | |
| 2006/0227085 A1 | 10/2006 | Boldt, Jr. et al. | |
| 2009/0073275 A1* | 3/2009 | Awazu | H04N 5/2354 348/222.1 |
| 2013/0249396 A1 | 9/2013 | Hafner et al. | |
| 2014/0267866 A1 | 9/2014 | Short et al. | |
| 2015/0014716 A1* | 1/2015 | von Malm | H01L 33/62 257/89 |
| 2017/0269351 A1* | 9/2017 | Saari | G01J 3/32 |
| 2018/0101971 A1* | 4/2018 | Balasubramanian | G06F 16/9537 |

FOREIGN PATENT DOCUMENTS

| | | |
|---|---|---|
| DE | 102016124866 A | 6/2018 |
| DE | 102016124871 A | 6/2018 |
| EP | 1610265 A1 | 12/2005 |
| GB | 2429565 A | 2/2007 |
| WO | 2015150281 A1 | 10/2015 |
| WO | 2016174147 A1 | 11/2016 |
| WO | 2016183483 A1 | 11/2016 |

* cited by examiner

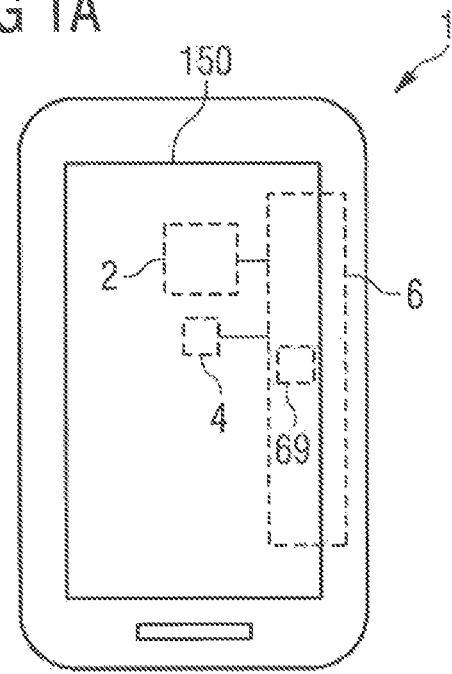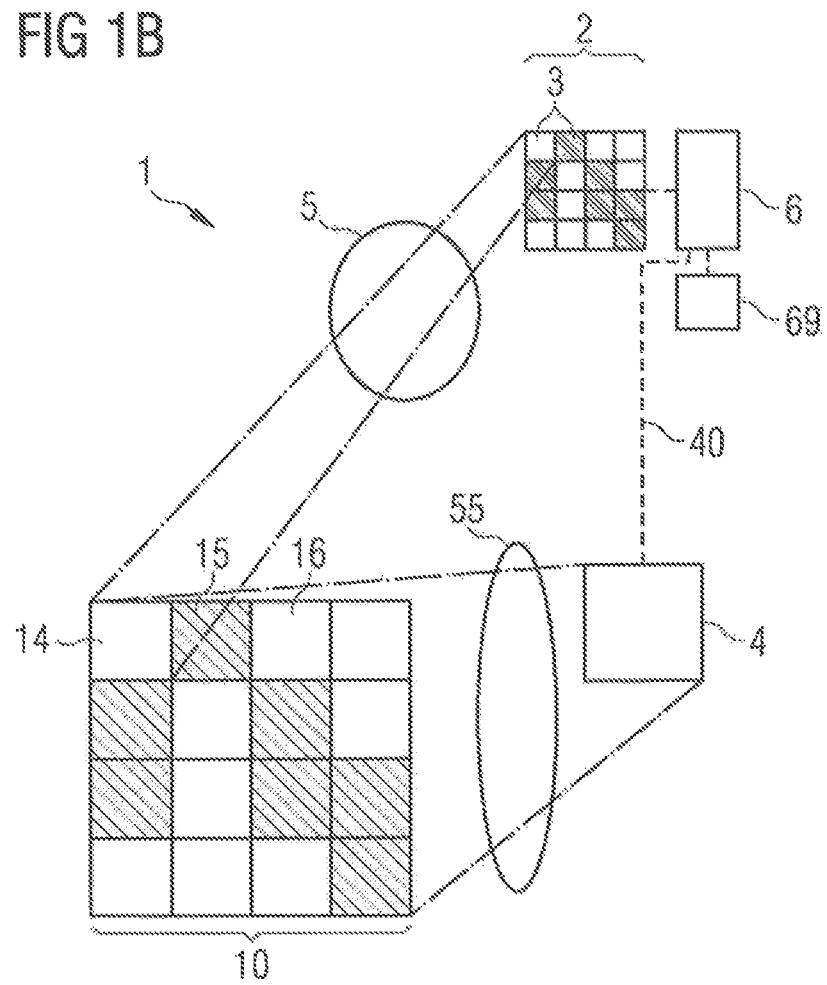

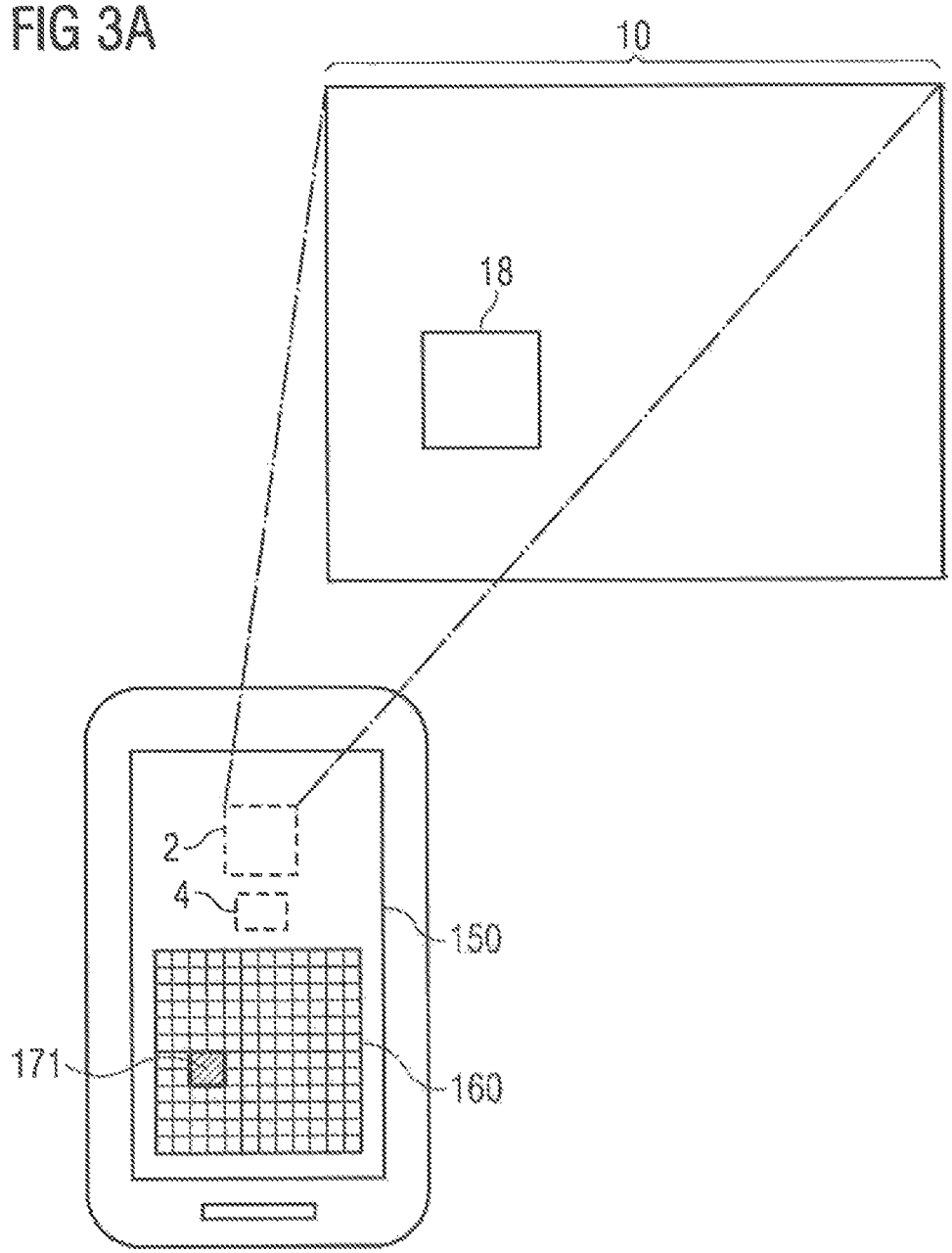

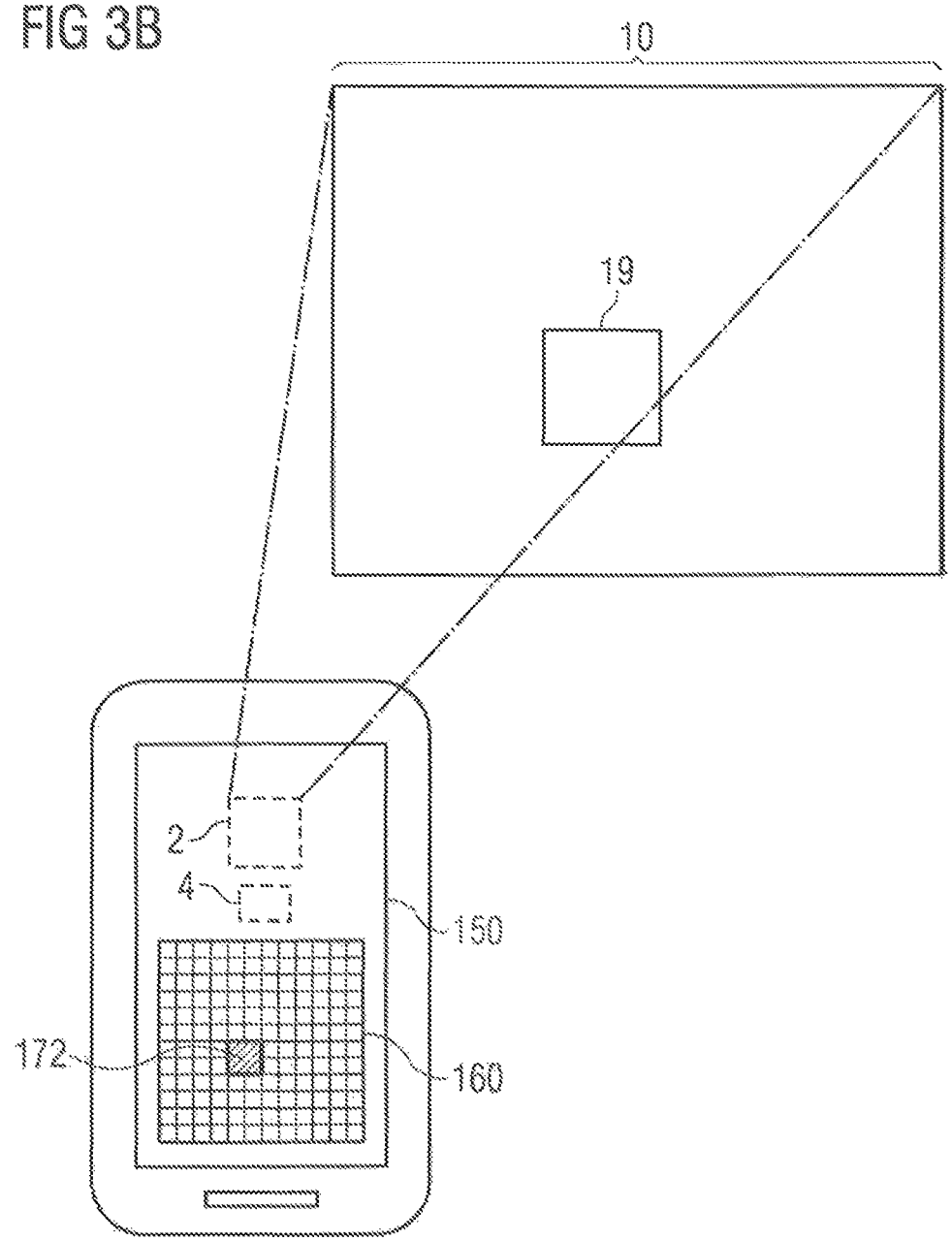

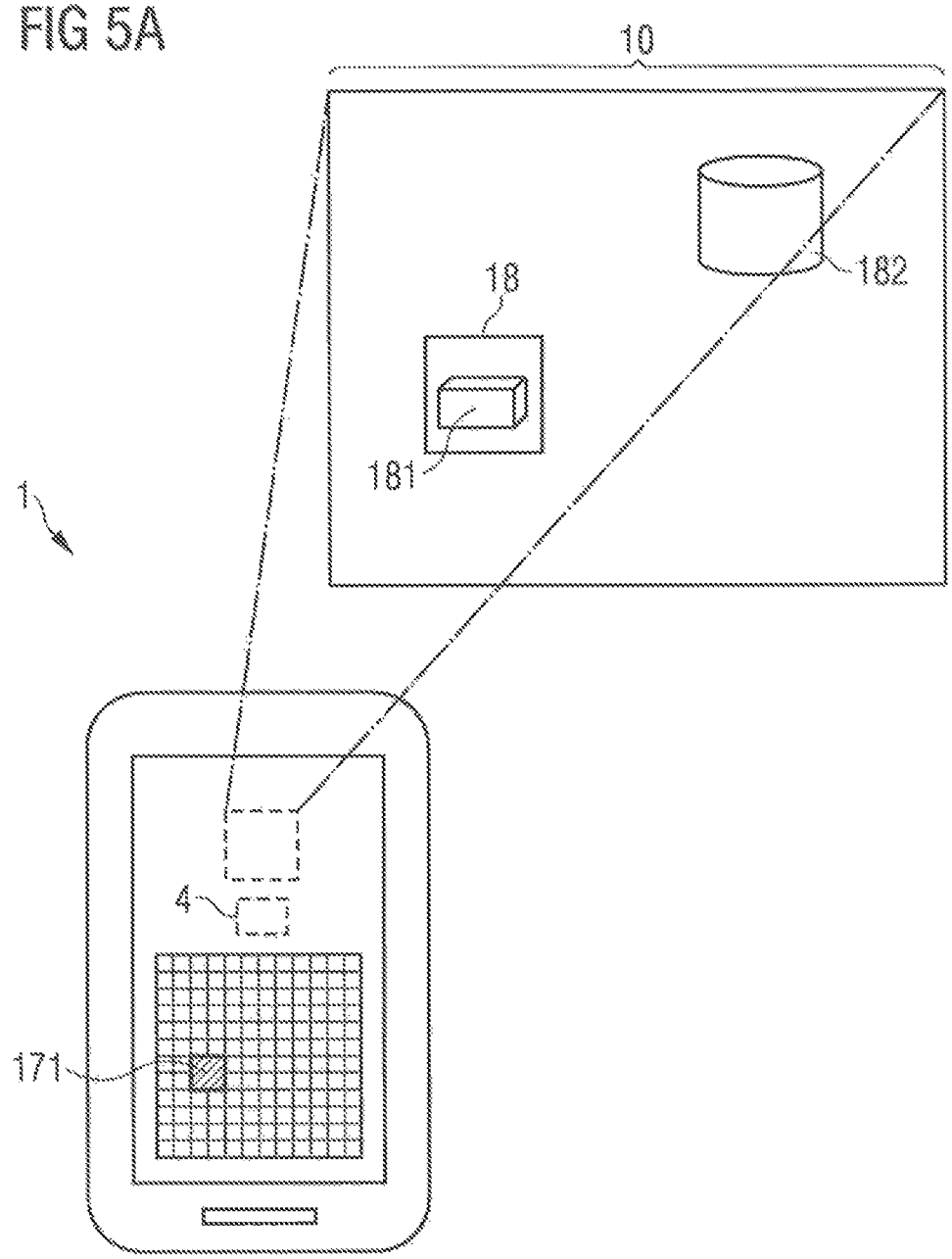

ASSEMBLY FOR LIGHTING AND RECORDING A SCENE

This patent application is a national phase filing under section 371 of PCT/EP2018/054403, filed Feb. 22, 2018, which claims the priority of German patent application 102017103883.3, filed Feb. 24, 2017, each of which is incorporated herein by reference in its entirety.

TECHNICAL FIELD

The present specification provides an arrangement for illuminating and recording a scene.

BACKGROUND

Electronic devices such as smartphones or tablets typically have a camera for recoding images, wherein a flash is usually provided for the use in low-light conditions. However, the type of illumination is typically defined during the production of the device and cannot be changed. In addition, aging effects in the flash may cause unwanted changes in the illumination during the life of the device.

SUMMARY OF THE INVENTION

Embodiments provide improvements to the versatility and efficiency of the illumination of a scene.

According to at least one embodiment of the arrangement for illuminating and recording a scene in a field of view, the arrangement comprises a light source. The light source is formed to emit light from the spectral range from infrared radiation to UV radiation, in particular visible light, during operation. The light from the light source illuminates a field of view that can be recorded by a camera in the arrangement. The scene to be recorded and illuminated is located within the field of view.

According to at least one embodiment of the arrangement, the arrangement comprises a control device. The control device is formed to operate the light source. This is to say that the light source can be supplied with current with the aid of the control device. In addition, the control device may be intended to control and/or regulate the function of the light source. The control of the light source by the control device may be dependent on parameters which may, for example, be predetermined by a user of the arrangement and/or by another element of the arrangement. The other element of the arrangement may be a brightness detector, an infrared detector, a camera and/or a device to measure the distance between the arrangement and an object in the scene.

According to at least one embodiment of the arrangement, the arrangement comprises a camera for recording the scene. For example, the camera includes a CCD (Charge Coupled Device) sensor for recording one or more images of the scene, a processing unit to process the signals from the CDD sensor, and a storage unit to record the scene, for example, as a file in an image file format. The camera can be connected to the control device of the arrangement so that the light source can be controlled, for example, as a function of parameters calculated from the signals received by the CCD sensor.

According to at least one embodiment of the arrangement, the light source comprises a semiconductor component with a plurality of pixels. The light source may consist of the semiconductor component or the light source may comprise two or more identical or different semiconductor components, each of which may comprise a plurality of pixels.

The pixels are the radiation-emitting components of the semiconductor component. This is to say that each pixel can generate light of the light source. In particular, the pixels can be operated independently of one another, so that exactly one pixel, several pixels or all pixels of the semiconductor component can be operated at the same time. Each pixel is operable with an individual supply with current. For example, the pixels are located in one or several active matrix circuits.

The term "operable with an individual supply with current" comprises in particular the operability with an individual current intensity and/or with an individual duty cycle.

For example, a pixel is operated with the maximum current allowed for the pixel and/or a duty cycle of 100%, while another pixel is operated with a reduced current and/or a reduced duty cycle. By means of pixels that emit light of different brightness, subareas of the field of view can result in the field of view, which are illuminated with different illuminances.

According to at least one embodiment of the arrangement, each pixel is formed for illuminating the field of view partially. This is to say, for example, that via at least one optical element the light generated in a pixel is directed onto a part of the field of view, so that a certain part of the field of view is illuminated by each pixel. In this way it is possible for the scene to be specifically illuminated by the light source in terms of illuminance and the color location of the illuminated light. In particular, illumination can be achieved by illuminating different areas with different illuminances and/or with light from different color locations or color temperatures.

According to at least one embodiment of the arrangement, the control circuit is formed to operate the pixels of the semiconductor component. This is to say that with the control device, the pixels of the semiconductor component of the light source can be operated individually and independently of one another. In this way, the different illumination of different subareas of the field of view and thus of different subareas of the scene described above can be achieved by means of the control device.

According to at least one embodiment of the arrangement, the control device has a memory in which operational data of the light source are stored. The memory can also be physically spaced apart from other parts of the control device, such as switches in the form of transistors. In other words, the memory is generally understood as part of the control device as long as operational data stored in the memory are or can be taken into account during operation of the light sources.

The operational data of the light source is generally understood to be data that can be used to determine which current supply is required during operation of the light source. The current supply can be adjusted in particular via the current intensity and/or the duty cycle.

The operational data include, for example, characteristic data measured specifically for the specific light source or characteristic data being characteristic for such a light source. For example, the operational data includes characteristic data for brightness and/or color location as a function of current, temperature and/or number of operating hours already performed. In particular, the operational data can be stored in the memory for each individual pixel, for a group of pixels or for all pixels. Furthermore, the operational data can contain, for example, a brightness to be achieved and/or a color location to be achieved.

Parameters determined by sensors during operation of the arrangement can also be taken into account, such as an operating temperature, a humidity, an ambient brightness or a color temperature of the scene to be illuminated.

According to at least one embodiment of the arrangement, the control device is formed to operate the pixels on the basis of the operational data. Knowing the current operating parameters, such as the temperature and/or the operating hours, the operational data can be used to determine which current and/or duty cycle is required to achieve a given radiation characteristic, for example, with respect to the color location or the brightness.

According to at least one embodiment of the arrangement, the arrangement is formed to perform an adaptation of at least a part of the operational data in the memory during operation of the arrangement. The operational data are therefore not, or at least not exclusively, data that already exist when the arrangement is created and must be stored in the memory. Rather, the memory is accessible during operation of the arrangement for an adaptation of the operational data. This allows, for example, an ageing behavior of the light source or a changed requirement profile for the light source to be taken into account during operation of the arrangement. In other words, the operational data can still be adapted to the arrangement during operation, for example, triggered by a user of the arrangement. For example, the arrangement is formed in such a way that the adaptation is fully automated, partially automated or manually performed by the user.

In at least one embodiment, an arrangement for illuminating and recording a scene in a field of view comprises a light source for illuminating the scene, a control device for operating the light source and a camera for recording the scene. The light source is formed in particular as a flash light and has a plurality of pixels, which are each formed for illuminating the scene partially. The control device has a memory in which the operational data of the light source are stored. The control device is formed to operate the pixels on the basis of the operational data and the arrangement is formed to perform an adaptation of at least some of the operational data in the memory during operation of the arrangement.

Therefore, an adaptation of the operational data can carried out during operation of the arrangement. For example, after such an adaptation, at least one pixel is driven with the same operating parameters and the same predetermined values for the radiation characteristic on the basis of other operational data, such as a larger or smaller current and/or a larger or smaller duty cycle. For example, a reduction in brightness caused by aging in the specific light source can be compensated in full or at least in part by increasing the current and/or the duty cycle. This adaptation can be made separately for each individual pixel, a group of pixels or all pixels.

Furthermore, for example, a particularly user-induced adaptation can be carried out if the light source should have a short-term or permanent radiation characteristic that deviates from the original radiation characteristic in the as-delivered state of the arrangement. For example, an originally homogeneous or at least largely homogeneous illumination of a scene can be adapted in such a way that certain subareas of the scene are illuminated differently than other subareas, for example, to achieve artistic effects. For example, different subareas, in particular those predetermined by the user, are illuminated with spectral components that differ from one another.

The arrangement may be an electronic device such as a digital imaging camera, a video camera, a mobile telephone, a tablet or a surveillance camera, or a component of such a mobile electronic device.

An arrangement described here is based, among other things, on the following considerations. In particular, in mobile devices such as mobile phones, tablets and cameras, individual light emitting diodes are used as flashlights. However, these light emitting diodes are limited in terms of the brightness that can be provided, the color temperature of the light emitted and the field of view that can be illuminated.

With an arrangement with a light source having a semiconductor component with a plurality of pixels, a scene can be illuminated in such a way that an illumination with different illuminances and/or light of a different color location can take place in different subareas. This can, for example, result in an illumination that is as energy-saving as possible, since subareas of the scene, which are located at a large distance from the arrangement and would therefore not benefit from the illumination by the light source anyway, can be omitted from the illumination. In addition, the aging behavior of the light source is improved since the pixels are not operated at certain times while other pixels of the semiconductor component are operated. Overall, this reduces the average operating time of each pixel.

Furthermore, the arrangement is formed in accordance with at least one embodiment of the arrangement so that the adaptation of the operational data can be triggered by a user of the arrangement.

The user can therefore influence the radiation behavior of the light source. In contrast to this, a conventional flash light in a camera or a mobile phone, for example, is largely beyond the user's sphere of influence, so that the user can at best choose from predetermined basic flash light functions. This makes the arrangement particularly versatile.

Furthermore, a calibration can take place during the operation of the arrangement, for example, at a time desired by the user. This allows, for example, the compensation of different aging effects for different pixels and the associated changes in brightness and/or the color location of the pixels. A homogeneous illumination of the scene can thus be achieved over a longer operating time of the arrangement.

Furthermore, characteristic properties of the camera can also be taken into account without additional effort when adapting the operational data of the light source, since the operational data can be determined using an image of the scene recorded by the camera. The light source is therefore still adaptable to the specific camera of the arrangement during operation of the arrangement.

According to at least one embodiment of the arrangement, the light source is formed for illuminating different subareas of a field of view of the camera with light of different illuminance and/or different spectral components. For the illumination and recording of a scene, it is therefore possible to set which subareas of the field of view of the camera are irradiated with which illuminance and/or with which spectral components. The corresponding setting can be made automatically, for example, from a recording taken without a flash and/or from a recording taken with a pre-flash. Furthermore, the arrangement can be formed in such a way that the setting can be carried out completely or at least partially by the user.

According to at least one embodiment of the arrangement, at least some of the pixels are formed to emit light of different wavelengths.

According to at least one embodiment of the arrangement, the control device is formed to operate the light source in an adaptation mode, wherein the adaptation of the operational data are based on the recording of the scene by the camera. For example, the adaptation mode is formed for recording a recording of a given scene. For example, the given scene is a white wall or an area that has one or more specific test ranges, such as regions with specific colors. In particular, the arrangement can be formed so that only individual pixels or only pixels assigned to one another or only pixels that illuminate a specific region of the scene are operated simultaneously in the adaptation mode. Pixels assigned to one another are considered as pixels for which the radiation emitted by the assigned pixels is superimposable in the field of view, for example, to set the color location. Thus, pixels assigned to one another are intended to irradiate the same subarea of the field of view.

According to at least one embodiment of the arrangement, the arrangement is formed in such a way that, by means of the recording in the adaptation mode, an illumination of different subareas of the scene with respect to their color location and/or illuminance can be adjusted to one another by adapting the operational data of at least some pixels. For example, a difference between illuminance and/or a distance between two color locations in the CIE color diagram is at least 20% smaller for at least two subareas of the scene after the adjustment than before the adjustment. For example, a color location of a subarea can be set by adapting a current ratio between the assigned pixels intended for illuminating that subarea. Differently strong ageing effects of different pixels, which can lead to different illumination of the assigned subareas, can be compensated completely or at least partially during operation of the arrangement.

According to at least one embodiment of the arrangement, the scene in the field of view is irradiated successively by at least some pixels in the adaptation mode. For example, only the pixels assigned to a subarea are activated at the same time. For each subarea, a measurement of its illumination can therefore be carried out independently of the other pixels. This makes it possible to obtain a particularly reliable camera image for an adaption of the operational data separately for each pixel. Alternatively, the pixels that illuminate a region with several subareas can also be activated simultaneously. The time required to perform the adaptation mode can thus be reduced.

According to at least one embodiment of the arrangement, the arrangement is formed to determine adapted operational data on the basis of the recording obtained in the adaptation mode and to store it in the memory. The adapted operational data may replace the corresponding original operational data or may be stored in addition to the original operational data or previous adapted operational data, such as in the form of a retrievable user-specific data record.

According to at least one embodiment of the arrangement, the arrangement is formed to transmit the recording of the scene obtained in the adaptation mode to an external data processing center by means of data transmission and to store adapted operational data obtained from the external data processing center in the memory. For example, the external data processing center is provided by an external supplier, such as the producer of the arrangement, the producer of the light source or a supplier acting on their behalf. The arrangement itself does not have to be able to generate adapted operational data from the received image. This can be done externally by means of the data processing center.

According to at least one embodiment of the arrangement, the arrangement provides an externally accessible input interface. For example, for at least some pixels, the radiation to be emitted by these pixels during operation can be set in terms of color location and/or brightness by means of the input interface. For example, the input takes place via a user interface displayed on a screen of the arrangement.

According to at least one embodiment of the arrangement, for at least two subareas the illumination can be set independently of one another via the input interface with respect to color location and/or illuminance. For example, individual subareas can be selected on the user interface so that the user can assign a desired illumination to these subareas. Corresponding operational data can be assigned to the corresponding pixels and stored in the memory. The user therefore has direct access to the illumination of individual subareas and can illuminate them according to his desires, e.g., adapted to a specific scene to be illuminated. Artistic effects can thus be achieved by means of the arrangement without the need for additional light sources.

According to at least one embodiment of the arrangement, at least some of the pixels are formed to emit light of different wavelengths. This is to say, for example, that a semiconductor component comprises two types of pixels, wherein the pixels of the first type radiating light in a first wavelength range and the pixels of the second type radiating light in a second wavelength range. Furthermore, the semiconductor component may comprise pixels of a third, fourth and further types, wherein the pixels of different types emit light of different wavelengths in pairs. For example, the semiconductor component may include pixels of a first type that emit warm white light during operation. Warm white light is particularly white light with a color temperature of at most 3,500 Kelvin. Furthermore, it is possible that the semiconductor component comprises pixels of the second type that generate cold white light during operation. Cold white light is particularly white light with a color temperature of over 4,000 Kelvin. Furthermore, it is conceivable that the semiconductor component may comprise pixels of further type that emit colored light, such as blue, red and/or green light, during operation.

With such different pixels, the scene can be illuminated differently in different subareas with respect to the color location of the illuminating light.

According to at least one embodiment of the arrangement, the arrangement comprises pixels of a first type and pixels of a second type, wherein the pixels of a first type are arranged in a first matrix arrangement and the pixels of a second type are arranged in a second matrix arrangement, wherein the first matrix arrangement and the second matrix arrangement are laterally spaced from one another. In other words, the pixels of the first type and the pixels of the second type are spatially separated next to one another. In particular, there is no pixel of a first type between any two pixels of a second type and vice versa. For example, an optical element of the arrangement is formed such that each pixel of a first type in the first matrix arrangement is associated with a pixel of the second type in the second matrix arrangement so that radiation emitted by the pixel of the first type and the associated pixel of the second type overlaps in the field of view.

In particular, the term 'matrix arrangement' generally refers to a two-dimensional arrangement of a plurality of pixels, for example, in a regular rectangular or hexagonal grid. In particular, the individual elements of the matrix arrangement can be controlled independently of one another.

According to at least one embodiment of the arrangement, the pixels of the first type and pixels of the second type are arranged in a common matrix arrangement. For example, between at least two pixels of the first type there is a pixel of the second type or vice versa. The pixels of the first type and the pixels of the second type, for example, are arranged alternately in rows or columns or in a checkboard-like pattern.

According to at least one embodiment of the arrangement, the light source comprises at least one semiconductor component having at least one semiconductor chip, wherein the semiconductor chip comprises at least one pixel or a plurality of pixels.

The pixels of different types can be assigned to the same semiconductor component, in particular to the same semiconductor chip. This is to say that the semiconductor component then comprises pixels of different types. In addition, the light source may comprise two or more semiconductor components, wherein the semiconductor components differ in the types of pixels they comprise. For example, a semiconductor component may only contain pixels that emit warm white light during operation, whereas another semiconductor component may only contain pixels that emit cold white light during operation.

The pixels may be part of a single semiconductor component or the light source may comprise two or more semiconductor components comprising the pixels. The semiconductor components, in turn, can each comprise one or more semiconductor chips. This is to say that it is possible in particular that each pixel comprises a single semiconductor chip, for example, a single light-emitting diode chip. Furthermore, it is possible that two, several or all pixels of a semiconductor component are formed by a single semiconductor chip, for example, a single light emitting diode chip. In this case, the semiconductor chip is a pixelated semiconductor chip that is structured in separately controllable areas, where each area, for example, forms a pixel.

The light source comprises in particular at least one optical element, which is formed to direct the light from pixels of different types into the same subarea of a field of view of the camera. In this way, different subareas can be illuminated with light of different properties such as different illuminance and/or different color locations.

According to at least one embodiment of the arrangement, the light source comprises at least one semiconductor component having at least one semiconductor chip comprising two or more of the plurality of pixels. In this embodiment, the light source thus comprises at least one pixelated semiconductor chip, in which the pixels are formed as separately controllable luminous areas of the semiconductor chip. In particular, the pixels of such a semiconductor chip are produced together on a common growth substrate and comprise an active region, in which electromagnetic radiation is generated during operation, which has the same composition for all pixels of the semiconductor chip within the production tolerance. In particular, semiconductor layers of the active region do not differ with respect to their layer thickness and their material composition, or at most in the context of production-related lateral fluctuations in epitaxial deposition, for example.

With such a pixelated semiconductor chip, particularly small distances between adjacent pixels can be achieved, since the pixels are not placed individually on a carrier, but are generated by structuring a larger structure, such as a semiconductor wafer. In this case, the light source can therefore be formed to be particularly space-saving.

BRIEF DESCRIPTION OF THE DRAWINGS

Further embodiments and experiences result from the following description of the exemplary embodiments in connection with the Figures.

They show:

FIGS. 1A and 1B show an exemplary embodiment of an arrangement using a schematic plan view (FIG. 1A) and a schematic representation of the functional principle (FIG. 1B);

FIGS. 3A and 3B show an exemplary embodiment of an adaptation mode for the arrangement at two different points in time;

FIGS. 5A and 5B show an exemplary embodiment of an adaptation mode for the arrangement at two different points in time.

Figure 2A:
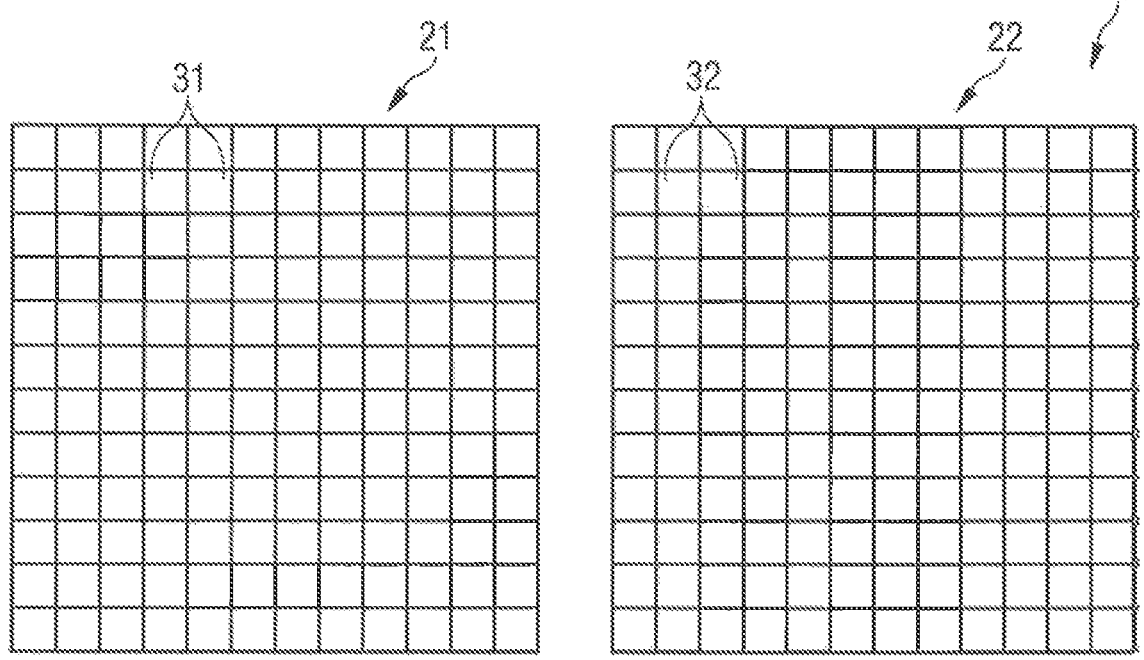
FIGS. 2A and 2B show an exemplary embodiment of an arrangement in schematic plan view (FIG. 2A) and in sectional view (FIG. 2B)

Same, similar or similar acting elements are provided in the Figures with the same reference signs.

The figures are schematic representations and therefore not necessarily true to scale. Rather, individual elements may be exaggeratedly large for improved representation and/or understanding.

DETAILED DESCRIPTION OF ILLUSTRATIVE EMBODIMENTS

FIGS. 1A and 1B show an arrangement 1 for illuminating and recording a scene in a field of view 10. The arrangement has a light source 2 for illuminating the field of view. The light source 2 is formed for illuminating different subareas 14, 15, 16 of the field of view 10 with light of different illuminance and/or different spectral components.

For this purpose, the light source has a plurality of pixels 3, which are each formed for illuminating a subarea 14, 15, 16 of the field of view 10. The radiation generated during operation of the light source 2 is directed into the field of view 10 by means of an optical element 5.

The arrangement 1 has a control device 6 for operating the light source 2. By means of the control device, the individual pixels 3 of the light source 2 can be supplied with current, in particular independently of one another.

The arrangement 1 also has a camera 4 for recording the scene in the field of view 10. The scene in the field of view 10 is imaged onto a photosensitive part, such as a CCD sensor, of the camera 4 using a further optical element 55. A camera signal 40 generated by the camera is fed to the control device 6. Using the camera signal, an image of the scene in the field of view 10 can be created under illumination by the light source 1 and saved as an image file.

In FIG. 1B, the subareas 14 and 16 of the field of view 10 are not illuminated by way of example. In contrast, the pixel 3 assigned to subarea 15 is supplied with current, so that subarea 15 is illuminated. The illuminance can be set by the current supplied to pixel 3, for example, by the level of a constant current or by adapting the duty cycle at a constant current or by simultaneously adapting the current intensity and the duty cycle.

The scene in field of view 10 can therefore be selectively illuminated differently in different subareas in line with the scene to be illuminated. For example, regions of the scene that would anyway be outside the range of the radiation of the light source can be excluded from the current supply. This results in a particularly energy-efficient type of illumination.

The control device 6 also has a memory 69, in which the operational data of the light source 2 are stored. For example, the operational data at the time of the production of the light source 2 comprise known data of the light source, in particular of the individual pixels 3 of the light source 2.

For example, for at least some pixels or for all pixels, the behavior of the brightness and/or the color location is stored as a function of the current and/or the temperature. The operating modes may also have characteristic values for the light source, such as a typical ageing behavior of the light source. For example, the decrease in brightness and/or the change in the color location, i.e., the cx and/or cy coordinates in the CIE diagram, can be stored as a function of the operating hours in the form of expected values.

In particular, Arrangement 1 is formed to perform an adaptation of at least some of the operating modes in the memory 69 during operation of the arrangement. During operation of the arrangement, the individual light sources can therefore also be controlled on the basis of operational data, which are only determined during operation of the arrangement. For example, the adaptation of the operational data can be triggered by a user of the arrangement.

For this purpose, the arrangement can be formed for providing one or more adaptation modes. This will be explained in more detail in connection with the FIGS. 3A, 3B, 4, 5A and 5B.

The arrangement 1, for example, is a hand-held electronic device such as a smartphone, tablet, or digital camera, or part of such a device.

Figure 2B:
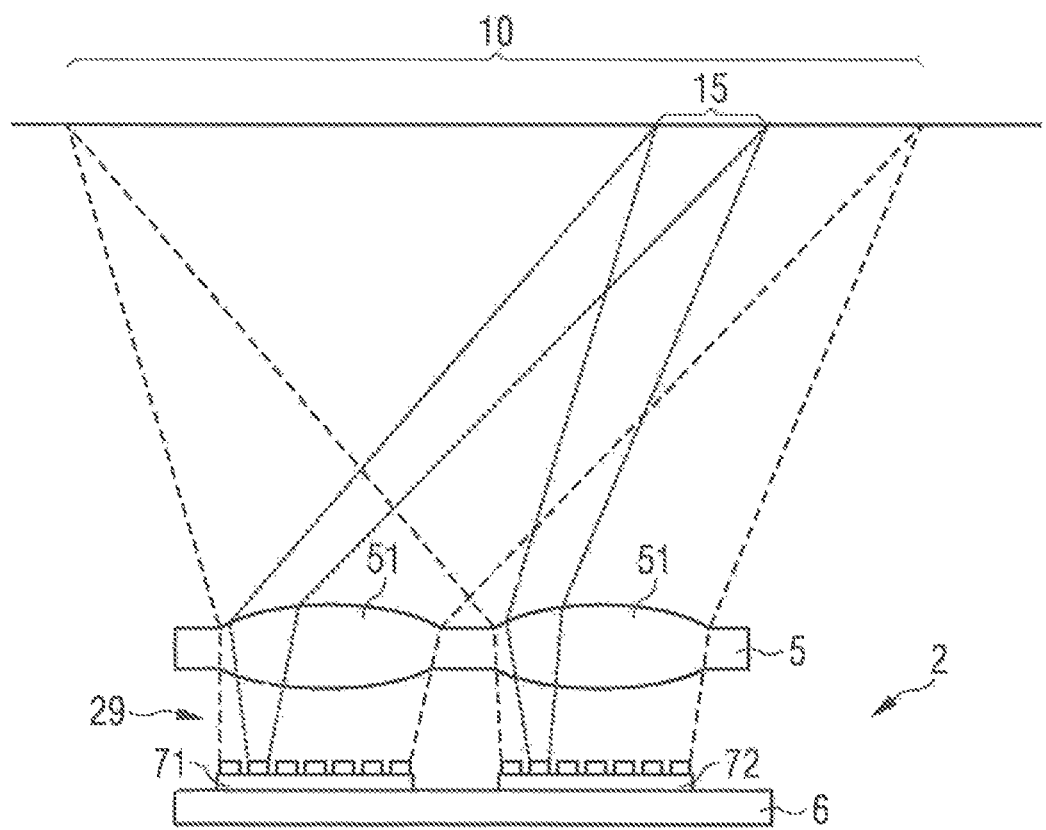

At least some pixels of the arrangement can be formed to emit light of different wavelengths. An exemplary embodiment of this is shown in FIGS. 2A and 2B, wherein in the plan view of FIG. 2A only the semiconductor component 29 is shown schematically for simplified representation.

The radiation emitted during operation of the semiconductor component 29 is directed by means of an optical element 5 into a field of view 10 to be illuminated.

The semiconductor component 29 has a plurality of pixels of the first type 31. The pixels of the first type 31 are arranged in a first matrix arrangement 21. Further, the semiconductor component 29 comprises a plurality of pixels of the second type 32, wherein the pixels of the second type 32 are arranged in a second matrix arrangement 22. The pixels of the first type and the pixels of the second type are different with respect to their radiation, in particular their spectral radiation. For example, pixels of the first type emit light that appears warm white to the human eye and pixels of the second type emit light that appears cold white to the human eye.

The first matrix arrangement 21 and the second matrix arrangement 22 are arranged side by side in the lateral direction. In plan view of the semiconductor component, the first matrix arrangement and the second matrix arrangement are arranged next to one another without overlapping.

The optical element 5 has a plurality of segments 51, wherein each matrix arrangement is associated with one segment, in particular one segment only. The segments 51 of the optical element are formed such that each pixel of the first matrix arrangement 21 is associated with a pixel of the second matrix arrangement 22, so that the radiation emitted by these pixels in the field of view 10 overlaps in a subarea 15 in particular congruently or substantially congruently. This is shown in FIG. 1B by means of the dotted lines, which schematically define a beam path extending from a pixel of the first matrix arrangement 21 and an associated pixel of the second matrix arrangement 22 starting through the associated segment 51 of the optical element 5 and defining the subarea 15 in the field of view 10. However, these beam paths only serve to explain the functional principle and do not represent precise beam paths in the sense of geometric optics.

In FIG. 2B, segments 51 have a convex shape both on a side facing the light source 2 as well as on a side facing away from the semiconductor component. However, the optical element can also be formed differently, for example, in the form of a Fresnel optic for each segment.

Optical elements with which a superposition of assigned pixels in a subarea of a field of view can take place are described in the German patent applications 10 2016 124 871.1 and 10 2016 124 866.5, the entire disclosure content of which is included in the present application by reference.

By means of a variation of the current ratio between the pixel of the first type 31 and the associated pixel of the second type 32, the color location in the subarea 15 of the field of view 10 illuminated by these pixels can be adjusted during operation of arrangement 1.

The arrangement 1 also has a control device 6, via which the pixels of the first type 31 and the pixels of the second type 32 can be operated. Possible configurations for the electrical connection between the pixels and the control device as well as details of the light source 2 are described in more detail using FIGS. 6 to 8.

The number of pixels of the first type 31 and pixels of the second type 32 can be varied within wide limits. For example, the light source has between including 10 and including 1000 pixels of the first type. The number of pixels of a first type is preferably equal to the number of pixels of a second type.

A first exemplary embodiment of an adaptation mode is shown in FIGS. 3A and 3B. A graphical user interface on a screen 150 of the arrangement 1 provides an input interface for the user to adapt the operational data in the memory. For example, the user is shown an image 160 of the field of view 10 on the screen 150, which also shows the individual subareas that can be illuminated with the associated pixels. By selecting an initial selection range 171, a region 18 of the field of view is illuminated. In this exemplary embodiment, region 18 is so large that it comprises four subareas of the field of view 10, each of which is illuminated by one pixel or a plurality of pixels assigned to one another. Sequentially further regions of the field of view 10 can be illuminated, for example, a region 19 when selecting a second selection range 172 (FIG. 3B).

By means of the camera 4, a respective recording of the field of view 10 can be created, in each of which only one region of the field of view is illuminated. The adaptation mode is used, for example, to calibrate the light source. For example, a white wall, such as a room wall or a screen, is suitable as a scene to be recorded in the field of view 10.

In an arrangement 1 with different pixels, the pixels assigned to one another, for example, a pixel of the first type and an assigned pixel of the second type can be operated simultaneously. Thus, the color temperature can be determined for each region of the field of view and, if necessary, also for each part of the field of view 10 illuminated by the assigned pixels and adjusted if necessary. The sequential illumination of individual regions and the definition of the size of the individual regions can be carried out completely manually by the user, partially automated or fully automated.

By processing the camera data, the operational data in the memory for the individual pixels can be adapted to the arrangement in such a way that the illumination of different subareas of the scene, for example, with respect to their color location and/or illuminance, is adjusted. For this purpose, for example, an actual value can be determined for each region or each subarea on the basis of the camera data, for example, for the brightness and/or for the color location. A target value can be calculated from this actual value. For example, the target value is an arithmetic or geometric mean of the measured actual values, a lowest value of the actual values, or a highest value of the actual values, or a value between the lowest and highest values. Subsequently, it can be calculated, for example, on the basis of already stored operational data, how the supply with current to the assigned pixels has to be adapted for each subarea or region. For example, the operational data has characteristic data for the individual dependencies, so that it can be calculated how much, for example, a supply with current must be increased, for example, by increasing the constant current or the duty cycle, in order to adjust an actual value for brightness that is 10% too low compared to the target value to the target value. Correspondingly updated operational data can be stored in the memory. For example, the characteristic data can assume an approximately linear dependence of the individual parameters on the current. A calculation of the required adaptation factors is thus simplified. Of course, non-linear parameter dependencies can also be used if necessary.

If necessary, the above procedure can be repeated iteratively until the deviations in the illumination of the subareas or regions lie within a defined or user-definable limits around the target value.

In an analogous manner, the coordinates of the color location can be adapted by adapting the ratio of the current to the pixels assigned to one another.

In operation of arrangement 1, a calibration of the light source 2 can therefore be carried out. Ageing effects can thus be taken into account, in particular separately for each pixel or for a group of pixels of the light source and taking into account current illumination measurements such as illuminance and/or the color location. In contrast to considering aging in the form of typical characteristic data for the aging of the light source 2, it is thus also possible to take into account that different pixels show different age-related changes in the radiation. In this way, a particularly homogeneous illumination of the field of view can be achieved over the life of the arrangement.

Figure 4:
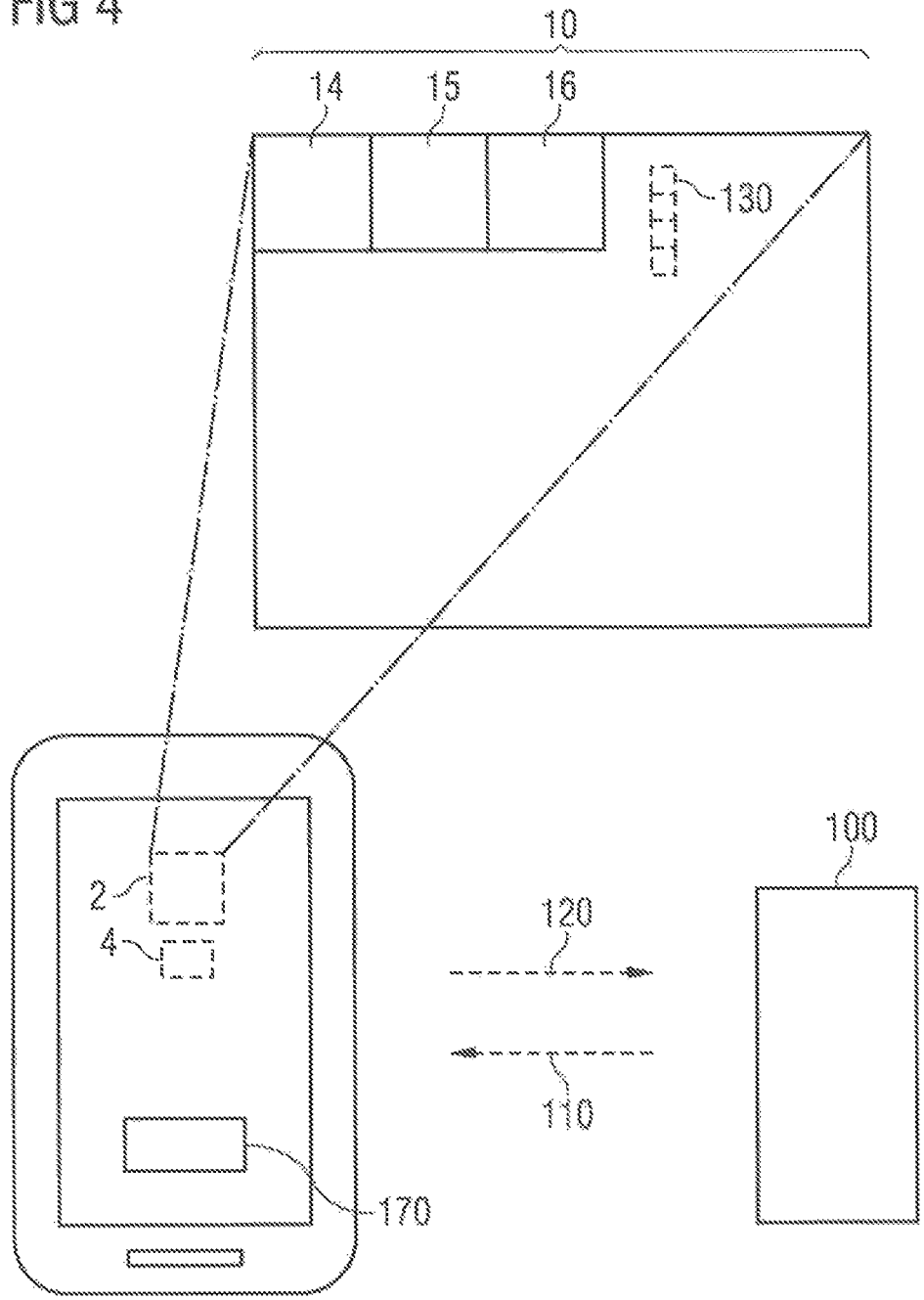
FIG. 4 shows an exemplary embodiment of an adaptation mode for the arrangement.

FIG. 4 shows a further exemplary embodiment of an adaptation mode. In this exemplary embodiment, the adaptation of the operational data is fully automated or at least almost fully automated. For example, the user is provided with a control element 170 on the screen 150 to trigger an adaptation. The scene in the field of view 10 can optionally have a test range 130, for example, a test range with different color regions with a precisely defined characteristic color location. Of course, such a test range can also be used in the exemplary embodiment described in connection with FIGS. 3A and 3B.

After a sequential or a simultaneous illumination of the individual subareas 14, 15, 16 of the field of view, camera data 120 received via camera 4 are transmitted to an external data processing center 100. This external data processing center wo calculates adapted operational data no from the camera data 120 and transmits this back to arrangement 1. In this case, the actual determination of the adapted operational data is therefore not carried out within arrangement 1, but outside the arrangement 1, for example, by an external provider. By means of an automated determination of adapted operational data results in an increased ease of use for the user, wherein the user himself can or must make only little or no settings. Of course, however, the arrangement can also be formed so that the user can make certain specifications for the adaptation, for example, with respect to the color location of the radiated radiation.

Figure 5B:
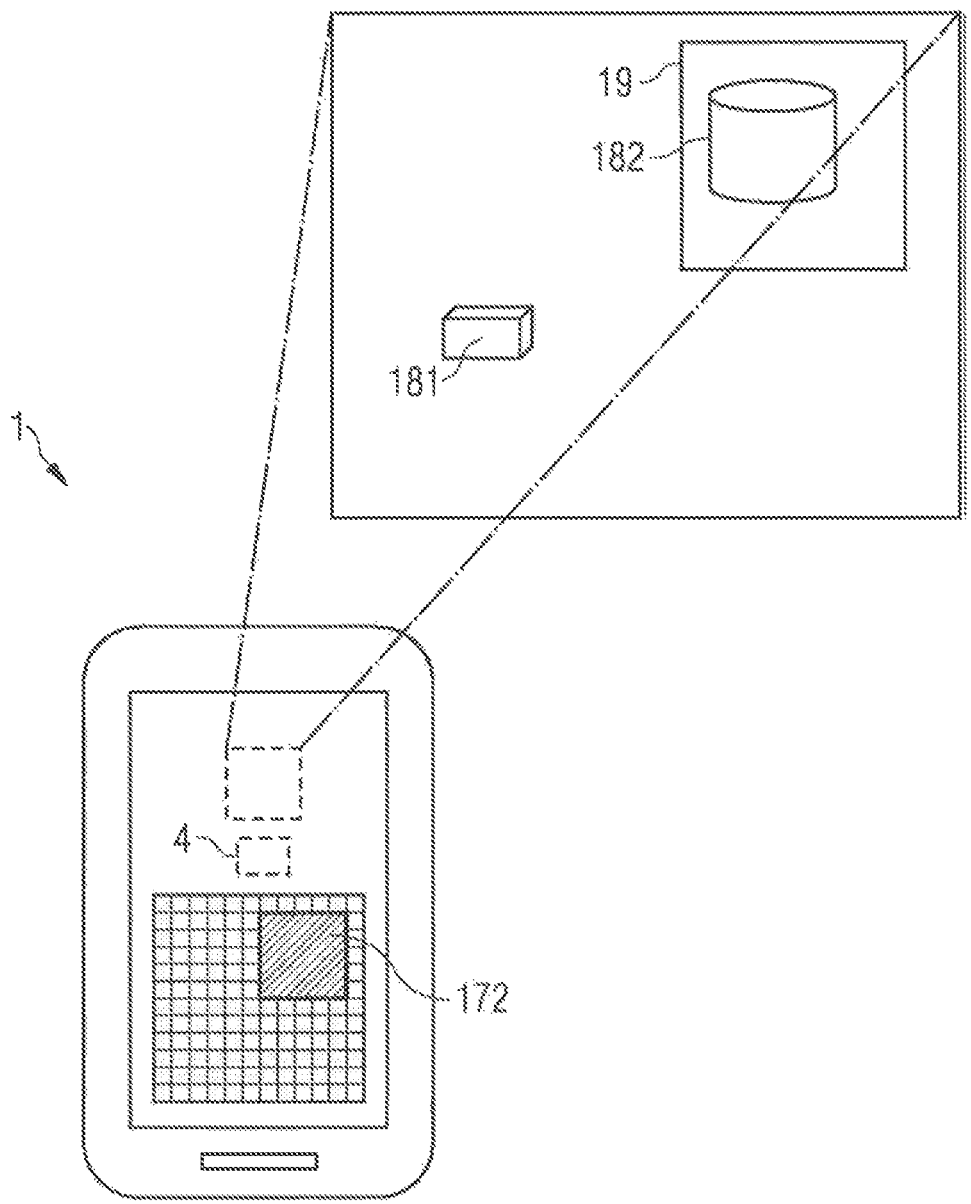

FIGS. 5A and 5B show an exemplary embodiment of an adaption mode that is not intended to calibrate the light source 2 but for illuminating a specific scene, in particular an inhomogeneous one. The scene in field of view 10, for example, comprises a first object 181 and a second object 182, wherein the term "object" refers in particular to objects, plants and living beings, such as humans and animals.

As described in connection with FIGS. 3A and 3B, the user can define a first selection range 171 for the first object 181 on the screen 150 and assign a certain illuminance and/or a certain color location to the pixels assigned to this selection range. This can be carried out sequentially for different objects in the scene, for example, as shown in FIG. 5B for the second object 182. The user thus has the possibility of illuminating individual regions of the scene to be recorded in the field of view 10 with different brightness, different color temperature and/or different color locations.

The first selection range 171 and the second selection range 172 can be selected manually or supported by optical image recognition. The information provided by the user about the desired irradiation can be translated into a suitable supply with current for the respective concerned pixels by means of already existing operational data in the memory.

By means of the described arrangement, the user has at any time the possibility to recalibrate the light source of his arrangement at regular intervals or as needed for individual high-quality image recordings. This results in an objectively measurable improvement in image homogeneity over the life of the arrangement. In addition, the user is given a high degree of freedom in the lighting and artistic design of his recordings. Such possibilities appeal in particular to technology enthusiasts and can be used by the producer of the arrangement as a sales argument.

The following are exemplary embodiments of light sources that are particularly suitable for an arrangement described above.

Figure 6:
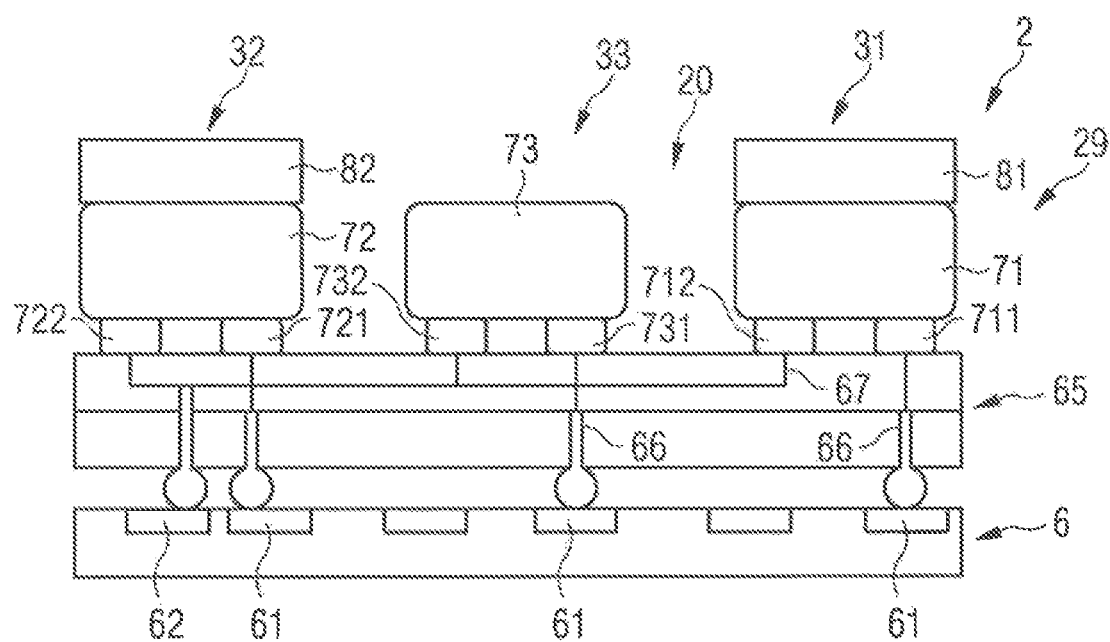
FIGS. 6, 7 and 8 show exemplary embodiments of a light source using a schematic sectional view.

FIG. 6 shows an exemplary embodiment of a light source 2 with a control device 6. The light source has a semiconductor component 29 in which the pixels are located in a common matrix arrangement 20. The pixels of the first type 3, the pixels of the second type 32 and the pixels of the third type 33 are arranged side by side as separate first semiconductor chips 71, second semiconductor chips 72 and third semiconductor chips 73, respectively. The pixels of the first type 31, the pixels of the second type 32 and the pixels of the third type 33 may each have similar semiconductor chips, so that the pixels of the first type 31 and the pixels of the second type 32 differ from one another only by the applied first radiation conversion element 81 and second radiation conversion element 82, respectively.

For example, the pixels of the first type emit 31 radiation in the red spectral range and the pixels of the second type emit radiation in the green spectral range. Pixels of the third type 33 can directly emit primary radiation in the blue spectral range, so that a radiation conversion element is not required. The pixels of the first type, the second type and the third type each provide an rgb color triplet. By superimposing the radiation of such a color triplet, a large color location can be covered in the CIE color diagram.

For example, a thickness of the first radiation conversion element 81 and/or the second radiation conversion element 82 is between 40 µm and 100 µm inclusive, in particular between 60 µm and 80 µm inclusive. This results in smoother transitions in the field of view between subareas to be illuminated than in the case of a thinner radiation conversion element. The radiation conversion elements therefore thus not only determine the color location of the radiated radiation, but also influence the spatial radiation characteristics.

However, the semiconductor chips may also differ from one another in terms of the material and, in particular, have different III-V compound semiconductor materials. III-V compound semiconductor materials are particularly suitable for radiation generation in the ultraviolet ($Al_xIn_yGa_{1-x-y}N$), visible ($Al_xIn_yGa_{1-x-y}N$, in particular for blue to green radiation, or $Al_xIn_yGa_{1-x-y}P$, in particular for yellow to red radiation) and infrared ($AlxIn_yGa_{1-x-y}As$) spectral ranges. In this case, $0 \leq x \leq 1$, $0 \leq y \leq 1$ and $x+y \leq 1$, in particular with $x \neq 1$, $y \neq 1$, $x \neq 0$ and/or $y \neq 0$. With III-V compound semiconductor materials, in particular from the mentioned material systems, high internal quantum efficiencies can furthermore be achieved in the radiation generation.

By forming the different pixels as separate semiconductor chips with respect to their radiation emission, the appropriate semiconductor material can be selected for the respective radiation generation. Such an arrangement can therefore be characterized by a particularly high efficiency of the radiation generation.

Of course, the individual semiconductor chips can also form more than one pixel. For example, the pixels of the first type 31, the pixels of the second type 32 and the pixels of the third type 33 may be arranged alternately in columns in a common matrix arrangement, wherein the first semiconductor chip 71 alone forms a column of the common matrix arrangement 20. The total number of semiconductor chips to be placed can thus be reduced.

For electrical contact, the first semiconductor chips 71, the second semiconductor chips 72 and the third semiconductor chips 73 can be arranged side by side in the lateral direction on an intermediate carrier 65. The intermediate carrier 65 results in a simplified electrical contact between the semiconductor chips and the control device 6. For example, a contact 71 of the first semiconductor chip 71, a contact 721 of the second semiconductor chip 72 and a contact 731 of the third semiconductor chip 73 are each electrically connected to a connection 61 of the control device 6. A counter contact 712 of the first semiconductor chip, a counter contact 722 of the second semiconductor chip and a counter contact 732 of the third semiconductor chip are electrically conductively connected to a common counter connection 62 of control device 6.

The electrical contact within the intermediate carrier 65 is takes place, for example, via supply lines 67 on or in the intermediate carrier. The supply lines can extend in places at different levels of the intermediate carrier. In plan view of the intermediate carrier, various supply lines can cross or overlap in places without being electrically connected to one another. In the vertical direction, the supply lines extend through vias 66 to the control device so that the control device 6 can be arranged directly below the semiconductor chips 71, 72, 73 intended for radiation generation. Deviating from this, the control device 6 can also be spatially separated from the semiconductor component 29 and electrically connected to it via supply lines 67. The vertical space requirement for the arrangement can thus be reduced.

Alternatively, as described in connection with FIGS. 2A and 2B, only pixels of two different types can be used. For example, the first semiconductor chip 71 and the second semiconductor chip 72 each emit radiation in the blue spectral range. The first radiation conversion element 81 partially converts this radiation into radiation with yellow, green and/or red spectral components, so that the pixels of the first type emit mixed light that appears warm white. In contrast, the second radiation conversion element 82 is formed in such a way that the radiation emitted by the pixels of the second type 32 appears cold-white in total.

Figure 7:
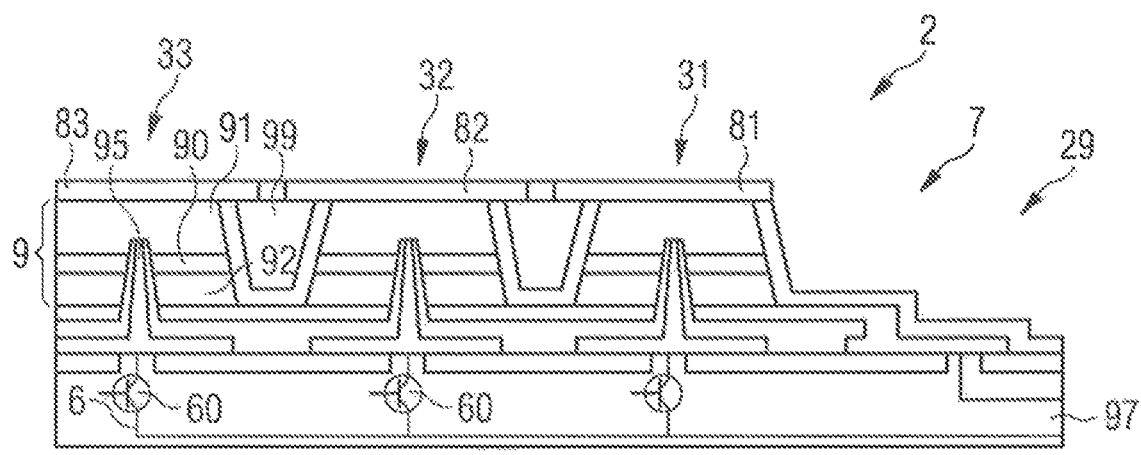

FIG. 7 shows an exemplary embodiment of a light source 2 with a semiconductor component 29, in which several pixels are integrated into a common semiconductor chip 7. For example, several pixels of one type, for example, several pixels of the first type or several pixels of the second type or several pixels of the third type are integrated into a common semiconductor chip. Furthermore, pixels of different types, for example, pixels of the first type and pixels of the second type, can be integrated into a common semiconductor chip.

The semiconductor chip 7 has an in particular epitaxially deposited semiconductor layer sequence 9 with an active region 90 intended for the generation of radiation, wherein the active region 90 is arranged between a first semiconductor layer 91 of a first conductivity type, for example, n-conductive, in a second semiconductor layer 92 of a second conductivity type, for example, p-conductive, different from the first conductivity type.

The individual pixels, i.e., the pixels of the first type 31, the pixels of the second type 32 and the pixels of the third type 33, in particular the active regions of these pixels, each emerge from a subarea of the semiconductor layer sequence 9.

In particular, these subareas result from the same semiconductor layer sequence in the manufacture of the semiconductor chip, so that the semiconductor layers of the individual pixels do not differ in terms of their material and layer thickness apart from production-related lateral fluctuations.

The individual pixels are separated from one another by interspaces 99. The interspaces 99 cut through in particular the active regions 90 of neighboring pixels. For example, the interspaces cut through the entire semiconductor layer sequence in a vertical direction, i.e., perpendicular to a main plane of extension of the semiconductor layer sequence.

The semiconductor layer sequence 9 is arranged on a carrier 97. The carrier also serves for the mechanical stabilization of the semiconductor layer sequence 9, so that a growth substrate for the semiconductor layer sequence is no longer required for this and can therefore be removed.

A control device 6 with a plurality of switches 60 is arranged in the carrier 97. A switch 60 is assigned to each pixel so that the individual pixels can be operated independently of one another during operation of the arrangement. At least part of the electrical control device, such as a switch, is thus integrated into the semiconductor chip.

The first semiconductor layer 91 arranged on the side of the active region 90 facing away from the carrier 97 is electrically conductively connected to an associated switch 60 by means of recesses 95. The recesses extend through the second semiconductor layer 92 and the active region 90. The second semiconductor layers 92 of the pixels are electrically connected to one another and can be on the same electrical potential during operation of the arrangement 1. Both sides of the active region 90 are therefore accessible for electrical contact from the side facing the carrier 97. Of course, the electrical contact of the individual pixels can be varied within wide limits as long as the individual pixels can be individually controlled and, during operation of the semiconductor component 29, charge carriers from opposite sides enter the active region 90 and can recombine there by emission of radiation.

On the side of the semiconductor layer sequence 9 facing away from the carrier 97, a first radiation conversion element 81, a second radiation conversion element 82 and/or a diffuser element 83 each are assigned to the pixels of the first type 31, the pixels of the second type 32 and the pixels of the third type. The first radiation conversion element 81 and the second radiation conversion element 82 may be formed as described in FIG. 5. The diffuser element can optionally be provided to achieve a scattering effect similar to that of the first or second radiation conversion element.

The exemplary embodiment for a semiconductor component 29 described in FIG. 8 corresponds substantially to the exemplary embodiment described in connection with FIG. 7. In contrast to this, a common first radiation conversion element 81 extends over the semiconductor chip 7. The semiconductor chip 7 forms a plurality of similar pixels, for example, a plurality of pixels of the first type 31. Of course, such a common radiation conversion element can also be used for the formation of similar pixels in the exemplary embodiment described in connection with FIG. 7.

Figure 8:
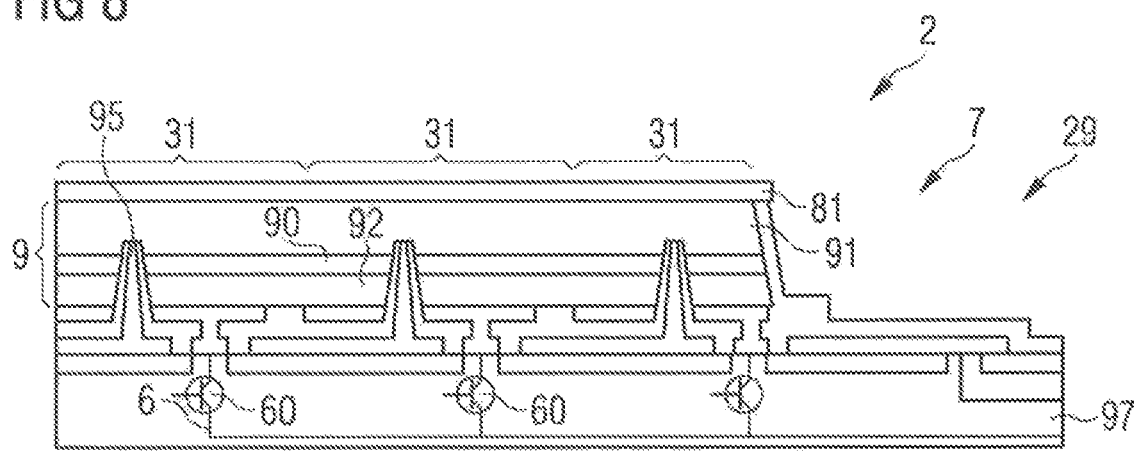

Furthermore, the semiconductor layer sequence 9 in the exemplary embodiment shown in FIG. 8 is not severed between adjacent pixels of the first type 31. The spatial separation between adjacent pixels is mainly due to the limited lateral current expansion of the electrical contact of the individual pixels. In the exemplary embodiment shown, the spatial extent of the electrical connection to the second semiconductor layer 92 determines the lateral extent of the radiation emission of a pixel of the first type 31. Analogously, the pixels of the second type 32 and/or the pixels of the third type can be formed by such a semiconductor chip.

This results in smooth transitions between the individual pixels of the first type 31. When such an illumination device is used as a segmented flash, the risk of too sharp transitions between subareas of the field of view to be illuminated to different degrees, which make images taken with such lighting could appear unnatural, is thus reduced.

Further embodiments of semiconductor chips with individually controllable pixels are described in U.S. Pat. Nos. 9,362,335 and 9,192,021 in another context. The entire disclosure content of these publications is hereby incorporated into the present application by reference. It has been shown that the basic type of the configuration and electrical contact of individual pixels in a common semiconductor chip for an illumination device for use in a flash is suitable.

Further embodiments of semiconductor chips with individually controllable emission regions are described in document US 2013/0249396 in another context. The entire disclosure content of this publication is hereby incorporated into the present application by reference.

The invention is not limited by the description of the exemplary embodiments. Rather, the invention includes any new feature and any combination of features, which in particular includes any combination of features in the claims, even if that feature or combination itself is not explicitly mentioned in the claims or the exemplary embodiments.

The invention claimed is:

1. An arrangement comprising:
a light source configured to illuminate a field of view;
a control circuit configured to operate the light source; and
a camera configured to record a scene in the field of view,
wherein the light source is formed as a flash and has a plurality of pixels, each pixel configured to illuminate the field of view partially,
wherein the light source comprises at least one semiconductor component having at least one semiconductor chip,
wherein the semiconductor chip has an semiconductor layer sequence with an active region,
wherein the semiconductor chip comprises at least some of the plurality of pixels,
wherein the plurality of pixels are configured to generate radiation of the light source,
wherein the semiconductor chip has an epitaxially deposited semiconductor layer sequence,
wherein each active region of the at least some of the plurality of pixels is arranged at a subarea of the semiconductor layer sequence,
wherein the subareas result from the same semiconductor layer sequence,
wherein the semiconductor component comprises pixels of a first type and pixels of a second type,
wherein the pixels of the first type are arranged in a first matrix arrangement and the pixels of the second type are arranged in a second matrix arrangement,
wherein the first matrix arrangement and the second matrix arrangement are laterally spaced apart from one another,
wherein the control circuit has a memory configured to store operational data of the light source,
wherein the control circuit is configured to operate the pixels on basis of the operational data, and
wherein the arrangement is configured to perform an adaptation of at least a part of the operational data in the memory during operation of the arrangement.

2. The arrangement according to claim 1, wherein the adaptation of the operational data is triggerable by a user of the arrangement.

3. The arrangement according to claim 1, wherein the light source is configured to illuminate different subareas of the field of view with light of different illuminance and/or different spectral components.

4. The arrangement according to claim 1, wherein at least some of the pixels are configured to emit light of different wavelengths.

5. The arrangement according to claim 1, wherein the control circuit is configured to operate the light source in an adaptation mode, and wherein the adaptation of the operational data is carried out on basis of a recording of the scene by the camera.

6. The arrangement according to claim 5, wherein the arrangement is configured to determine and store the operational data, which are adapted to the recording obtained in the adaptation mode and stored in the memory.

7. The arrangement according to claim 5, wherein the arrangement is configured to transmit the recording of the scene obtained in the adaptation mode to an external data processing center by data transmission and to store adapted operational data obtained from the external data processing center in the memory.

8. The arrangement according to claim 5, wherein at least some of the pixels are configured to successively irradiate the scene in the adaptation mode.

9. The arrangement according to claim 1, wherein an illumination of different subareas of the scene with respect to their color location and/or their illuminance are adjustable to one another by a recording in an adaptation mode by performing the adaptation of the operational data of at least some pixels.

10. The arrangement according to claim 1, further comprising an externally accessible input interface, wherein the radiation is adjustable by the input interface with respect to a color location and/or a brightness.

11. The arrangement according to claim 10, wherein, for at least two pixels, radiation to be emitted by these two pixels during operation is independently settable of one another via the input interface with respect to a color location and/or a brightness.

12. The arrangement according to claim 1, wherein the light source comprises at least one optical element configured to direct the light from pixels of different types into the same subarea of the field of view.

13. The arrangement according to claim 12, wherein the optical element has a plurality of segments, and wherein each matrix arrangement is associated with one segment.

14. The arrangement according to claim 13, wherein the segments of the optical element are arranged such that each pixel of the first matrix arrangement is associated with a pixel of the second matrix arrangement, so that the radiation emitted by these pixels overlaps in the same subarea.

15. An arrangement comprising:
a light source configured to illuminate a field of view;
a control circuit configured to operate the light source; and
a camera configured to record a scene in the field of view,
wherein the light source is formed as a flash and has a plurality of pixels, each pixel configured to illuminate the field of view partially,
wherein the light source comprises at least one semiconductor component having at least one semiconductor chip,
wherein the semiconductor chip has an semiconductor layer sequence with an active region,
wherein the semiconductor chip comprises the plurality of pixels,
wherein the plurality of pixels are configured to generate radiation of the light source,
wherein the semiconductor chip has an epitaxially deposited semiconductor layer sequence,
wherein each active region of a pixel is arranged at a subarea of the semiconductor layer sequence,
wherein the subareas result from the same semiconductor layer sequence,
wherein the control circuit has a memory configured to store operational data of the light source,
wherein the control circuit is configured to operate the pixels on basis of the operational data,
wherein the arrangement is configured to perform an adaptation of at least a part of the operational data in the memory during operation of the arrangement,
wherein the control circuit is configured to operate the light source in an adaptation mode,
wherein the adaptation of the operational data is carried out on basis of a recording of the scene by the camera, and
wherein at least some of the pixels are configured to successively irradiate the scene in the adaptation mode.

* * * * *